(12) United States Patent
Fujiki et al.

(10) Patent No.: US 9,917,098 B2
(45) Date of Patent: Mar. 13, 2018

(54) SEMICONDUCTOR MEMORY DEVICE AND MANUFACTURING THE SAME

(71) Applicant: Toshiba Memory Corporation, Minato-ku (JP)

(72) Inventors: Jun Fujiki, Mie (JP); Takeshi Kamigaichi, Yokkaichi (JP); Hideaki Aochi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/228,378

(22) Filed: Aug. 4, 2016

(65) Prior Publication Data

US 2017/0200734 A1 Jul. 13, 2017

Related U.S. Application Data

(60) Provisional application No. 62/277,511, filed on Jan. 12, 2016.

(51) Int. Cl.
| | | |
|---|---|---|
| H01L 27/148 | (2006.01) | |
| H01L 29/80 | (2006.01) | |
| H01L 27/108 | (2006.01) | |
| H01L 21/00 | (2006.01) | |
| H01L 27/11582 | (2017.01) | |

(Continued)

(52) U.S. Cl.
CPC .. *H01L 27/11582* (2013.01); *H01L 21/02532* (2013.01); *H01L 21/02592* (2013.01); *H01L 21/28273* (2013.01); *H01L 21/28282* (2013.01); *H01L 23/53204* (2013.01); *H01L 27/11519* (2013.01); *H01L 27/11556* (2013.01); *H01L 27/11565* (2013.01); *H01L 29/04* (2013.01);

(Continued)

(58) Field of Classification Search
CPC ......... H01L 27/11514; H01L 27/11521; H01L 27/11524; H01L 27/1157; H01L 27/11578; H01L 29/7889; H01L 29/7926; H01L 21/823431; H01L 21/823487; H01L 21/823821; H01L 21/823885; H01L 27/0886; H01L 27/0924; H01L 27/11551; H01L 27/11597; H01L 29/7788; H01L 29/7827; H01L 29/785; H01L 29/78642
USPC ............... 438/156, 173, 192, 206, 212, 268; 257/220, 263, 302, 328
See application file for complete search history.

(56) References Cited

U.S. PATENT DOCUMENTS

| | | | |
|---|---|---|---|
| 8,030,701 B2 | 10/2011 | Yasuda | |
| 2016/0079265 A1* | 3/2016 | Akutsu | H01L 27/11582 257/314 |

FOREIGN PATENT DOCUMENTS

| | | |
|---|---|---|
| JP | 2010-74096 | 4/2010 |
| JP | 2013-115295 | 6/2013 |

* cited by examiner

*Primary Examiner* — Hsien Ming Lee
(74) *Attorney, Agent, or Firm* — Oblon, McClelland, Maier & Neustadt, L.L.P.

(57) ABSTRACT

One embodiment includes a plurality of memory cells and a plurality of conducting layers. The memory cells are three-dimensionally disposed on a semiconductor substrate. The conducting layers are disposed in a laminating direction. Each of the plurality of conducting layers is connected to each of the plurality of memory cells. Each conducting layer has a structure where a first conductive film and a second conductive film are laminated in the laminating direction. The conducting layers adjacent to one another in
(Continued)

the laminating direction have a laminating order of the first conductive film and the second conductive film different from one another.

21 Claims, 17 Drawing Sheets

(51) Int. Cl.
    *H01L 27/11556*    (2017.01)
    *H01L 29/16*    (2006.01)
    *H01L 29/04*    (2006.01)
    *H01L 29/45*    (2006.01)
    *H01L 29/417*    (2006.01)
    *H01L 23/532*    (2006.01)
    *H01L 21/28*    (2006.01)
    *H01L 21/02*    (2006.01)
    *H01L 27/11519*    (2017.01)
    *H01L 27/11565*    (2017.01)

(52) U.S. Cl.
    CPC ........ *H01L 29/16* (2013.01); *H01L 29/41741* (2013.01); *H01L 29/456* (2013.01)

SEMICONDUCTOR MEMORY DEVICE AND MANUFACTURING THE SAME

CROSS REFERENCE TO RELATED APPLICATION

This application is based upon and claims the benefit of priority from U.S. Provisional Patent Application No. 62/277,511, filed on Jan. 12, 2016, the entire contents of which are incorporated herein by reference.

FIELD

Embodiments described herein relate generally to a semiconductor memory device and manufacturing the same.

BACKGROUND

Description of the Related Art

There has been known a flash memory that accumulates electric charges on an electric charge accumulating layer and a floating gate to store data. Such flash memory is connected by various methods such as a NAND type and a NOR type, thus constituting a semiconductor memory device. Recently, such semiconductor memory devices have been large capacity and highly integrated. Then, to ensure a large capacity and a high integration, a semiconductor memory device whose memory cells are three-dimensionally disposed (three-dimensional semiconductor memory device) has been proposed. Ensuring both to have a large capacity and to be downsized has been also desired.

DETAILED DESCRIPTION

A semiconductor memory device according to one embodiment includes a plurality of memory cells that are three-dimensionally disposed on a semiconductor substrate, and a plurality of conducting layers that are disposed in a laminating direction. Each of the plurality of the conducting layers is connected to each of the plurality of the memory cells. At the same time, each of the plurality of the conducting layers has a structure where a first conductive film and a second conductive film are laminated in the laminating direction. The conducting layers adjacent one another in the laminating direction have different laminating orders of the first conductive film and the second conductive film.

[First Embodiment]
[Configuration]

Next, the following describes semiconductor memory devices according to embodiments in detail with reference to the accompanying drawings. Here, these embodiments are only examples. For example, the respective drawings of the semiconductor memory devices used in the following embodiments are schematically shown. The thickness, the width, the ratio, and a similar parameter of the layer are not necessarily identical to actual parameters.

The following embodiments relate to a semiconductor memory device in a structure where a plurality of Metal-Oxide-Nitride-Oxide-Semiconductor (MONOS) type memory cells (transistors) is laminated along a Z direction. The MONOS type memory cell includes on a substrate: a semiconductor film disposed in a columnar shape in a direction intersecting with a substrate surface (hereinafter referred to as a Z direction in the reference drawings) as a channel, and a gate electrode film disposed on the side surface of the semiconductor film via an electric charge accumulating layer. However, a similar structure is applicable to another type, for example, a Semiconductor-Oxide-Nitride-Oxide-Semiconductor (SONOS) type memory cell, a Metal-Aluminum Oxide-Nitride-Oxide-Semiconductor (MANOS) type memory cell, or a floating-gate type memory cell.

First Embodiment

Figure 1:
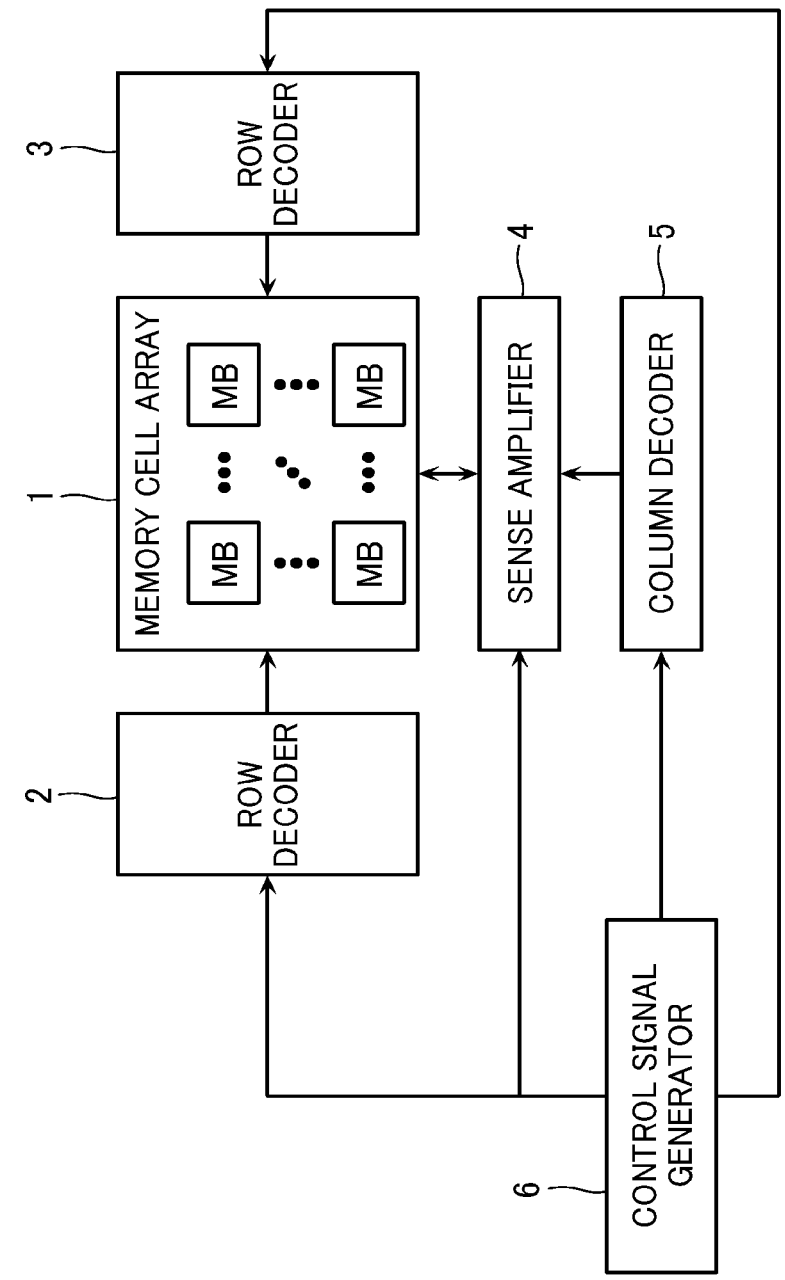
FIG. 1 is a function block diagram illustrating a schematic configuration of a semiconductor memory device according to a first embodiment.

FIG. 1 is a function block diagram illustrating a configuration of a semiconductor memory device according to a first embodiment. The semiconductor memory device according to the embodiment includes a memory cell array 1, row decoders 2 and 3, a sense amplifier 4, a column decoder 5, and, a control signal generator 6. The memory cell array 1 includes a plurality of memory blocks MB. Each memory block MB includes a plurality of three-dimensionally disposed memory cells MC (not shown, described below and shown in FIG. 3). The row decoders 2 and 3 decode retrieved block address signal or similar signal to control a writing operation and a reading operation of data in the memory cell array 1. The sense amplifier 4 detects electric signals flowing through the memory cell array 1 during the reading operation and amplifies the electric signals. The column decoder 5 decodes column address signals to control the sense amplifier 4. The control signal generator 6 steps up a reference voltage to generate a voltage used for the operations of writing, erasure, and reading. Besides, the control signal generator 6 generates control signals to control the row decoders 2 and 3, the sense amplifier 4, and the column decoder 5.

Figure 2:
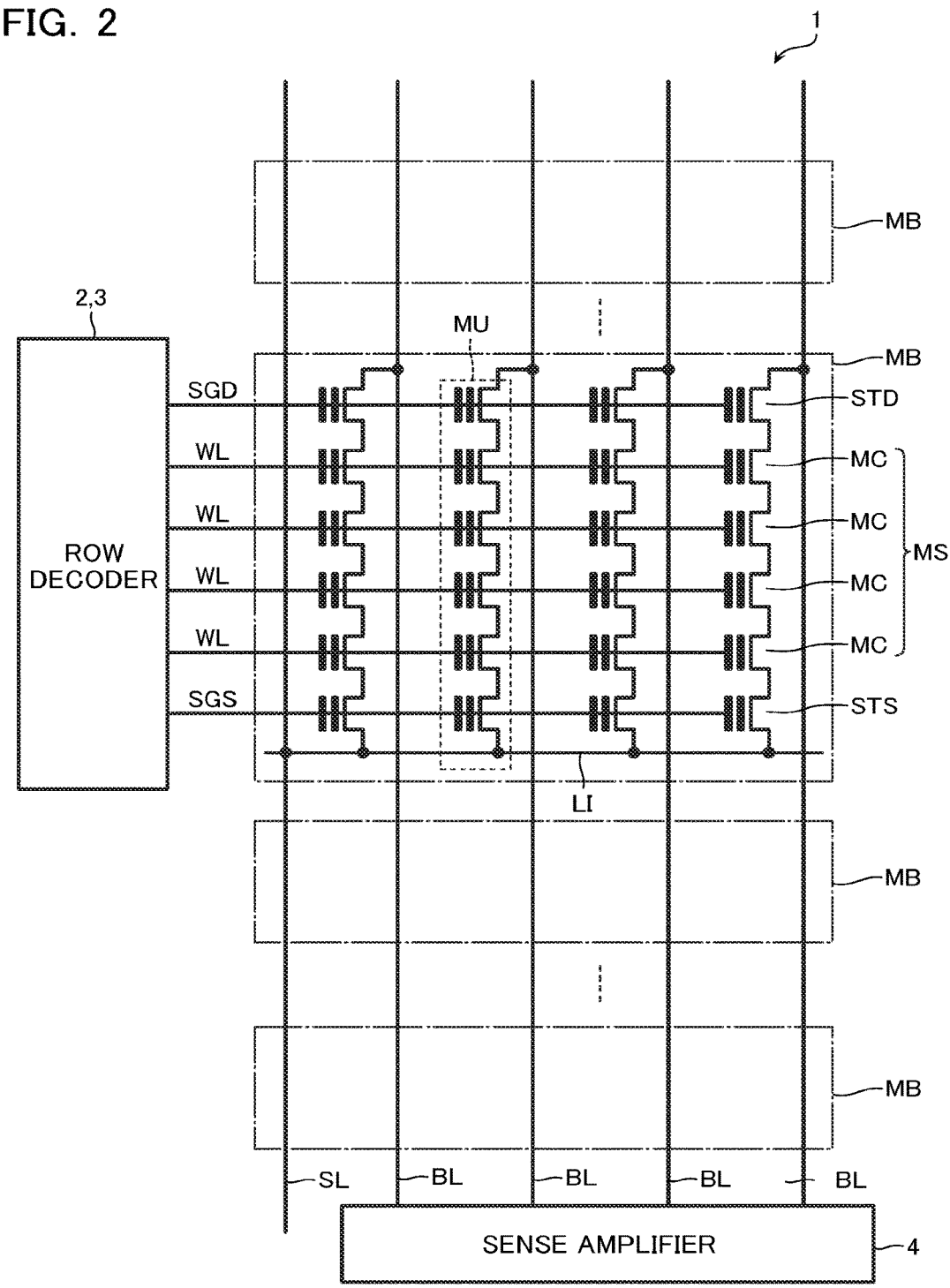
FIG. 2 is an equivalent circuit diagram illustrating a configuration of a memory cell array 1 of the semiconductor memory device.

FIG. 2 is an equivalent circuit diagram illustrating a configuration of a part of the memory cell array 1 according to the embodiment.

The memory cell array 1 according to the embodiment includes a plurality of memory blocks MB. To the plurality of the memory blocks MB, a plurality of bit lines BL and a source line SL are connected in common. Each memory block MB is connected to the sense amplifier 4 via the bit lines BL, and connected to a source line driver (not shown) via the source line SL.

The memory block MB includes a plurality of memory units MU. Each memory unit MU has one end connected to the bit line BL and the other end connected to the source line SL via the source contact LI.

The memory unit MU includes a plurality of memory cells MC connected in series. The memory cell MC, as described below, includes a semiconductor layer, an electric charge accumulating layer, and a control gate. Then, during each operation, the memory cell MC accumulates electric charges on the electric charge accumulating layer (writing operation) or erases electric charges (erasure operation) corresponding to a voltage applied to the control gate to vary a threshold. The magnitude of the threshold is detected to determine data stored in the memory cell MC (reading operation). Hereinafter, the plurality of the memory cells MC connected in series is referred to as a "memory string MS."

To each control gate of the plurality of memory cells MC that constitute the different memory strings MS, a word line WL is connected in common. The plurality of the memory cells MC are connected to the row decoder 2, 3 via the word line WL.

The memory unit MU includes a drain side selection gate transistor STD connected between the memory string MS and the bit line BL. To the control gate of the drain side selection gate transistor STD, a drain side selection gate line SGD is connected. The drain side selection gate line SGD is connected to the row decoder 2, 3 to selectively connect the memory string MS and the bit line BL corresponding to input signals.

The memory unit MU includes a source side selection gate transistor STS connected between the memory string MS and the source contact LI. To the control gate of the source side selection gate transistor STS, a source side selection gate line SGS is connected. The source side selection gate line SGS is connected to the row decoder 2, 3 to selectively connect the memory string MS and the source line SL corresponding to input signals.

Figure 3:
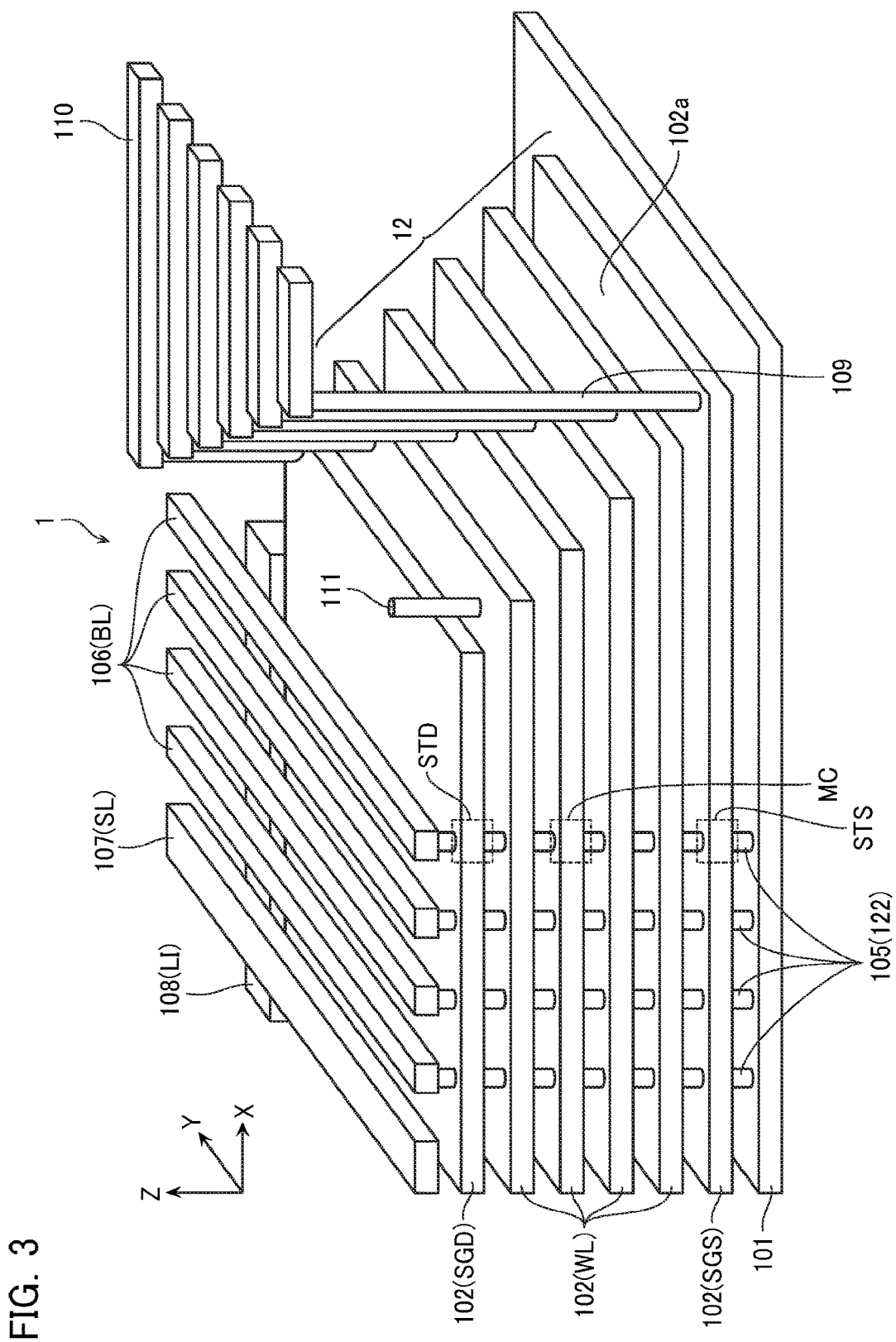
FIG. 3 is a perspective view illustrating the configuration of the memory cell array 1 of the semiconductor memory device.

FIG. 3 is a schematic perspective view illustrating the configuration of a part of the memory cell array 1. As shown in FIG. 3, to mainly describe main parts of the memory cell array 1 such as a conducting layer, some parts of the configuration such as an insulating layer are omitted.

The memory cell array 1 according to the embodiment includes a substrate 101 and a plurality of conducting layers 102 laminated on the substrate 101 in a Z direction. The memory cell array 1 also includes a plurality of memory pillars 105 extending in the Z direction. As shown in FIG. 3, intersection portions of the conducting layer 102 and the memory pillar 105 function as the source side selection gate transistor STS, the memory cell MC, or the drain side selection gate transistor STD. The conducting layer 102 is a conducting layer made of, for example, tungsten (W) and polysilicon. The conducting layer 102 functions as the word line WL, the source side selection gate line SGS, and the drain side selection gate line SGD.

A conducting layer 106 that functions as the bit line BL and a conducting layer 107 that functions as the source line SL are disposed over the conducting layer 102.

As shown in FIG. 3, the memory cell array 1 includes a conducting layer 108 that faces the side surface of the plurality of the conducting layers 102 in a Y direction and extends in an X direction. An lower surface of the conducting layer 108 is in contact with the substrate 101. The conducting layer 108 is a conducting layer made of, for example, tungsten (W). The conducting layer 108 functions as the source contact LI.

The plurality of the conducting layers 102 is formed in a staircase pattern on the end portion in the X direction to constitute a stepped portion 12.

The stepped portion 12 includes a contact portion 102a on each distal end of level differences constituting the stepped portion 12. The contact portion 102a includes a contact 109. The contact 109 is connected to an upper wiring 110. The stepped portion 12 may include a support pillar 111 extending in the Z direction to penetrate the stepped portion 12. The support pillar 111 functions to hold the posture of the laminated structure of the memory cell array 1 in a process, which will be described later, to replace a sacrificial layer to the conducting layer. While only one support pillar 111 is shown for simplification of explanations, a plurality of the support pillars 111 may be disposed.

Figure 4:
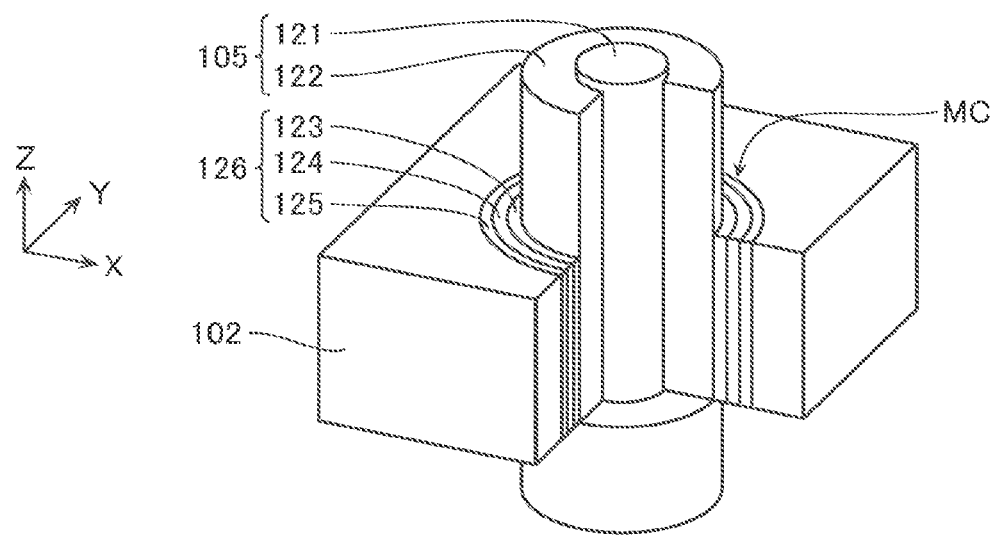
FIG. 4 is a schematic cross-sectional perspective view illustrating an exemplary configuration of one memory cell MC included in the semiconductor memory device.

FIG. 4 is a schematic perspective view illustrating the configuration of the memory cell MC. While the configuration of the memory cell MC is shown in FIG. 4, the source side selection gate transistor STS and the drain side selection gate transistor STD may be configured as well as the memory cell MC. As shown in FIG. 4, to mainly describe main configuration of the memory cell MC such as the conducting layer, the memory layer, or the semiconductor layer, some parts of the configuration such as the insulating layer disposed on the upper and lower of the conducting layer 102 or a barrier metal layer are omitted.

The memory cell MC is disposed on the intersection portion of the conducting layer 102 and the memory pillar 105 to extend in the Z direction. The memory pillar 105 includes a core insulating layer 121 and a semiconductor layer 122. The semiconductor layer 122 covers the sidewall of the core insulating layer 121. Then, a memory film 126 is disposed between the semiconductor layer 122 and the conducting layer 102. The memory film 126 includes a tunnel insulating layer 123, an electric charge accumulating layer 124, and a block insulating layer 125.

The core insulating layer 121 is constituted of the insulating layer made of, for example, silicon oxide. The semiconductor layer 122 is constituted of the insulating layer made of, for example, polysilicon. The semiconductor layer 122 functions as a channel body of the memory cell MC, the source side selection gate transistor STS, and the drain side selection gate transistor STD. The tunnel insulating layer 123 is constituted of the insulating layer made of, for example, silicon oxide. The electric charge accumulating layer 124 is constituted of the insulating layer capable of accumulating the electric charge made of, for example, silicon nitride. The block insulating layer 125 is constituted of the insulating layer made of, for example, silicon oxide, hafnium oxide ($HfO_x$), and tantalum oxide ($TaO_x$).

Figure 5:
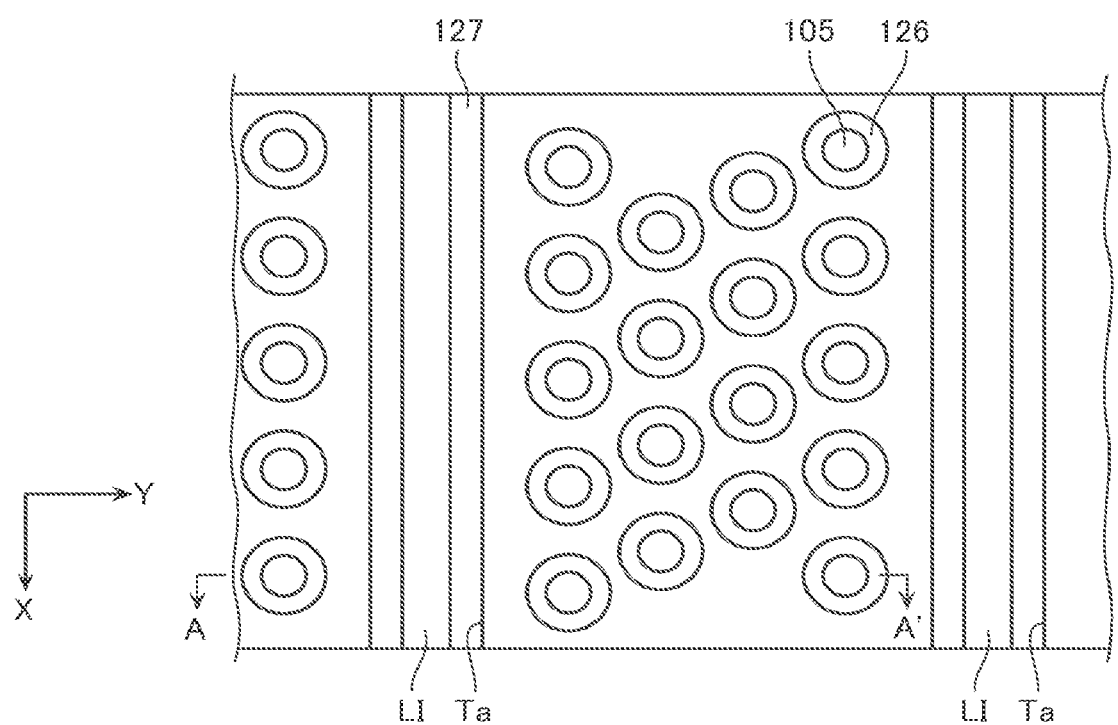
FIG. 5 is a plan view illustrating a part of the configuration of the memory cell array 1 included in the semiconductor memory device.
Figure 6:
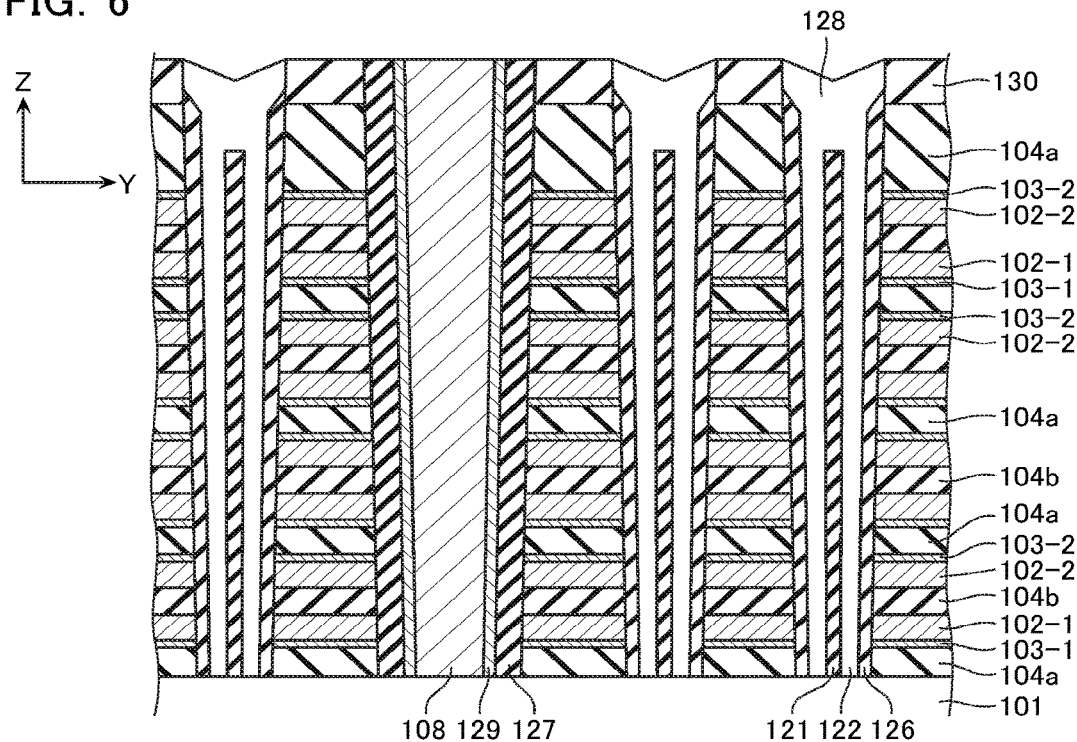
FIG. 6 is a schematic cross-sectional view illustrating the configuration of the semiconductor memory device.

Next, with reference to FIG. 5 and FIG. 6, a description will be given of the configuration of the semiconductor memory device according to the embodiment in further details. FIG. 5 is a plan view illustrating the configuration of a part of the memory cell array 1. FIG. 6 is a cross-sectional view of the memory cell array 1 along the Y direction (a cross-sectional view taken along a line A-A' in FIG. 5). As shown in FIG. 6, some parts of the configuration such as the upper wiring are omitted.

As shown in FIG. 5, according to the embodiment, the memory pillars 105 are disposed in a staggered pattern. The source contact LI is formed in a stripe shape to have the longitudinal direction in the X direction. The source contact LI is implanted in a trench Ta that divides the memory cell array 1 into block units via an interlayer insulating film 127.

As shown in FIG. 6, the memory cell array 1 according to the embodiment includes a plurality of conducting layers 102-1 and 102-2 on the substrate 101 laminated in the Z direction via interlayer insulating layers 104a and 104b. Hereinafter, in some cases, the conducting layers 102-1 and 102-2 are collectively referred to as the conducting layer 102, the interlayer insulating layers 104a and 104b are collectively referred to as an interlayer insulating layer 104, and barrier metal layers 103-1 and 103-2, which will be described later, are collectively referred to as a barrier metal layer 103. The conducting layer 102 functions as the word line WL, the source side selection gate line SGS, or the drain side selection gate line SGD. The interlayer insulating layer 104a on an uppermost layer includes a cover film 130 on the upper surface.

The memory pillar 105 extends in the Z direction, and the lower end of the memory pillar 105 is in contact with the substrate 101. A core semiconductor layer 128 covers the upper portion of the memory pillar 105 and the memory film 126. The core semiconductor layer 128 is constituted of a semiconductor such as amorphous silicon.

The interlayer insulating film 127 covers the side surface of the conducting layer 108, which functions as the source contact LI, in the Y direction via a barrier metal layer 129.

In the memory cell array 1 according to the embodiment, the word line WL has the configuration where the barrier metal layer 103 is disposed on only one surface of the upper surface or the lower surface of each conducting layer 102. For example, for the conducting layer 102-1 and the barrier metal layer 103-1 on the lowermost layer, the barrier metal layer 103-1 is disposed on the lower surface of the conducting layer 102-1. For the second conducting layer 102-2 and barrier metal layer 103-2 counting from the substrate 101, the barrier metal layer 103-2 is disposed on the upper surface of the conducting layer 102-2. Then, in the Z direction, the conducting layer 102-1 with the barrier metal layer 103-1 on the lower surface and the conducting layer 102-2 with the barrier metal layer 103-2 on the upper surface are laminated in alternation.

In other words, the word lines WL according to the embodiment are laminated such that a pair of word lines WL in which the conducting layers 102 are facing one another and a pair of word lines WL in which the barrier metal layers 103 are facing one another are repeatedly laminated in alternation except the word lines WL on the lowermost layer and the uppermost layer.

In the embodiment, a number of the layers of the word line WL where the barrier metal layer 103 is disposed on the lower surface of the conducting layer 102 and a number of the layers of the word line WL where the barrier metal layer 103 is disposed on the upper surface of the conducting layer 102 are identical.

As described above, recent semiconductor memory devices have been desired both to have a large capacity and to be downsized. Then, the word line WL tend to be thinned. On the other hand, if the word line WL is thinned, the resistance of the word line WL possibly increases to deteriorate the device property.

However, as the embodiment, in the case where the barrier metal layer 103 is disposed on only one of the upper surface or the lower surface of the conducting layer 102, the resistance of the word line WL is ensured to be reduced to increase compared with the case where the barrier metal layer 103 is disposed on both the upper surface and the lower surface of the conducting layer 102 because the film thickness of the conducting layer 102 can be ensured thicker by one layer of the barrier metal layer 103. That is, this prevents the device property from deteriorated.

[Manufacturing Method]

A manufacturing method for the semiconductor memory device according to the embodiment will be described by referring to FIG. 7 to FIG. 18.

Figure 7:
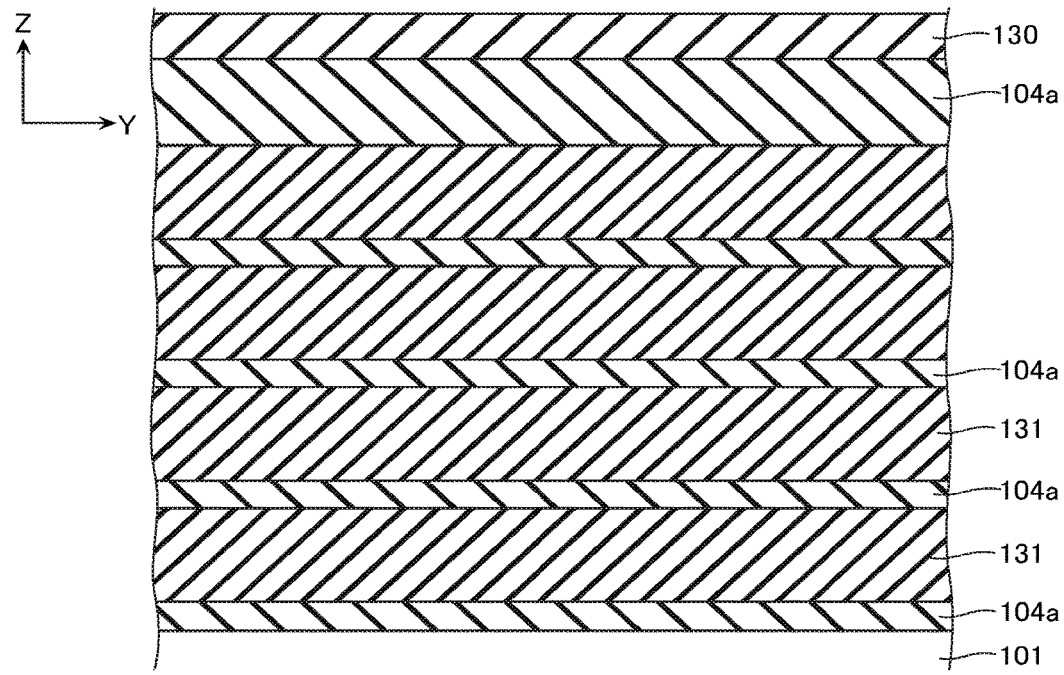
FIG. 7 to FIG. 18 are schematic cross-sectional views illustrating a manufacturing method for the semiconductor memory device.

As shown in FIG. 7, a plurality of the interlayer insulating layers 104a and sacrificial layers 131 are alternately laminated on the semiconductor substrate 101. On the upper surface of the interlayer insulating layer 104a on the uppermost layer, the cover film 130 is formed. The cover film 130 can be constituted of, for example, amorphous silicon or zinc oxide ($ZnO_x$). The cover film 130 functions to protect the upper portion of the memory pillar 105 formed in a later process.

Here, in a region where one sacrificial layer 131 is disposed, two conducting layers 102, two barrier metal layers 103, and one interlayer insulating layer 104b are formed in a later process. Therefore, the thickness of one sacrificial layer 131 in the Z direction is approximately equal to the sum of the thicknesses of these layers. However, when the sacrificial layer 131 constituted of such as nitride is removed by wet etching, the etching sometimes reaches to a part of the surface of the interlayer insulating layer 104a constituted of such as oxide to cause the surface of the interlayer insulating layer 104a to be retreated. In this case, the sacrificial layer 131 may be formed such that the sacrificial layer 131 to be formed has the thickness in the Z direction preliminarily subtracted by the thickness to be retreated.

Figure 8:
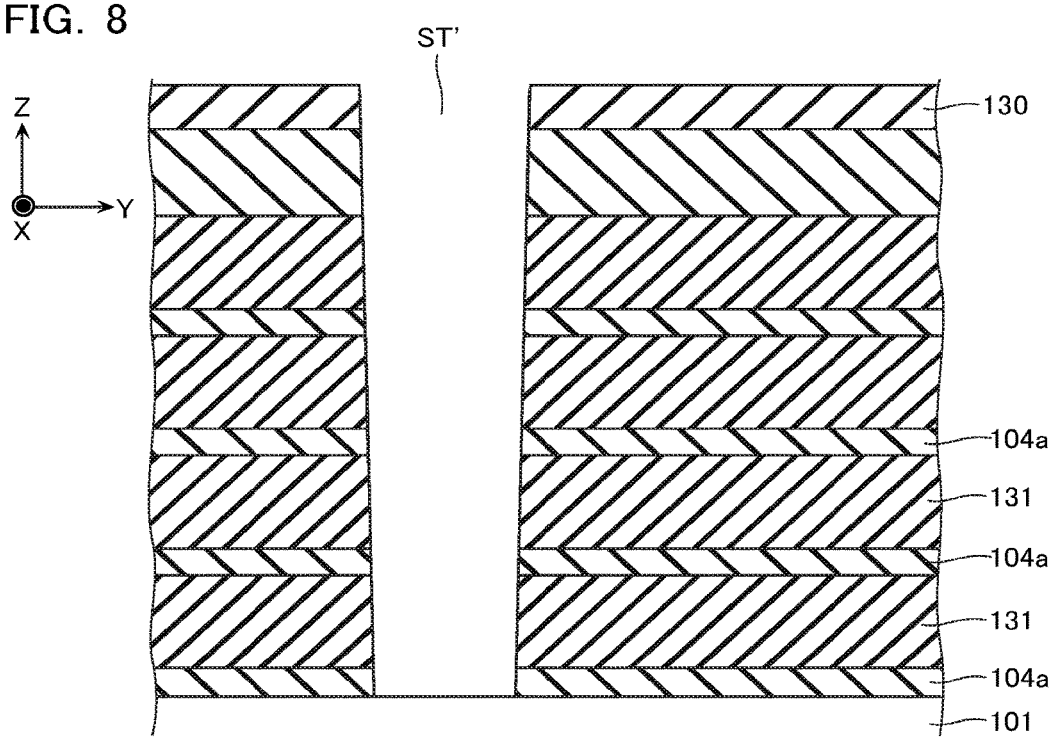

As shown in FIG. 8, a groove ST' extending in the X direction is formed by etching.

Figure 9:
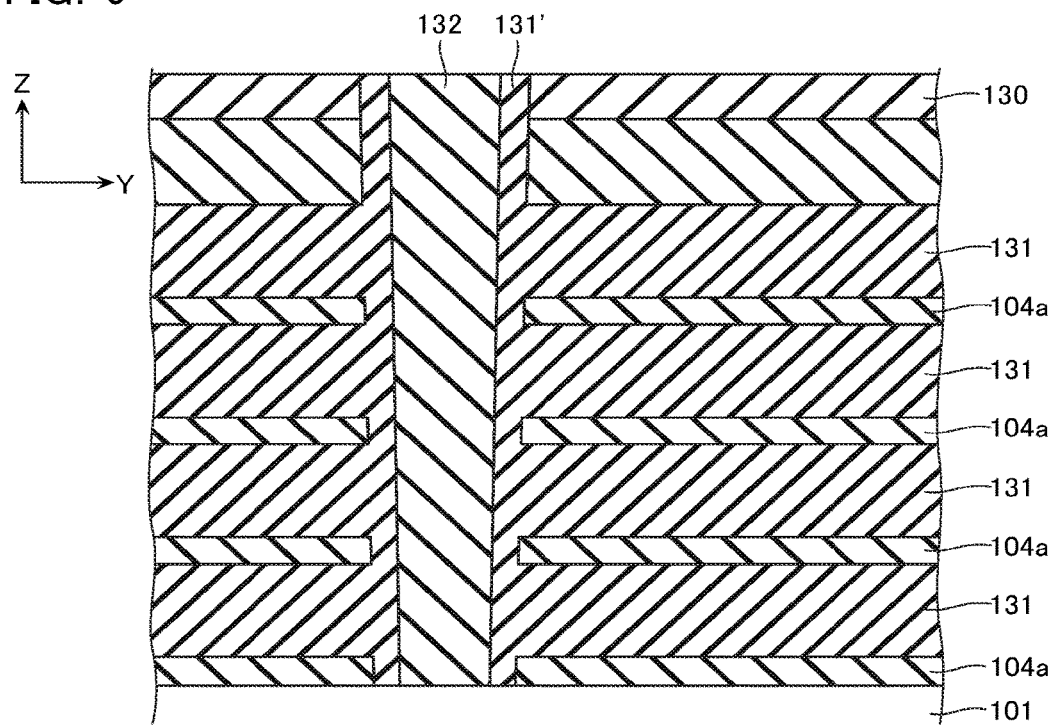

As shown in FIG. 9, forming the groove ST' exposes a sidewall of a laminated body constituted of the interlayer insulating layer 104a, the sacrificial layer 131, and the cover film 130, and on the sidewall, a sacrificial layer 131' is formed, and an interlayer insulating layer 132 is formed to fill the groove ST'. The sacrificial layer 131' can be constituted of material similar to the sacrificial layer 131, for example, silicon nitride. The interlayer insulating layer 132 can be constituted of, for example, silicon oxide.

Figure 10:
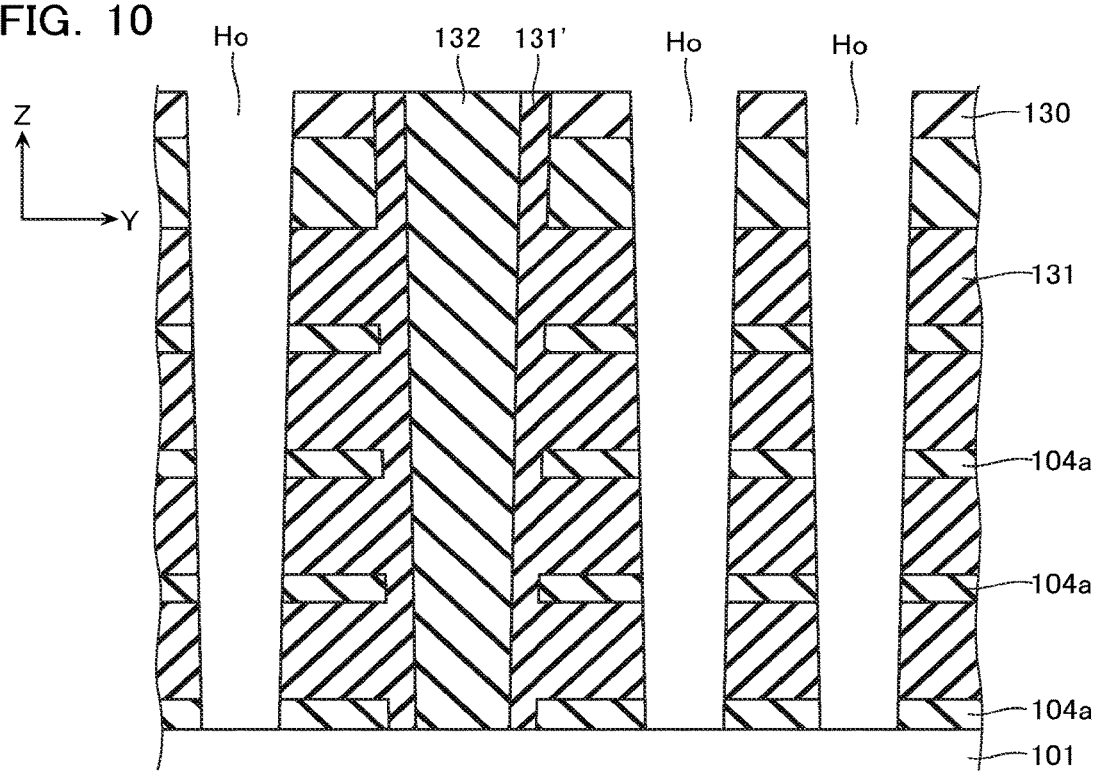

As shown in FIG. 10, a plurality of holes Ho are formed. The hole Ho is formed to perform the wet etching to remove the sacrificial layers 131 and 131'. In a region including the part where the hole Ho is formed, the memory pillar 105 is formed in a later process. Accordingly, the hole Ho is configured to have a diameter equal to or less than the diameter of the memory pillar 105, and the region where the hole Ho is formed is configured to be included in the region where the memory pillar 105 is formed.

Figure 11:
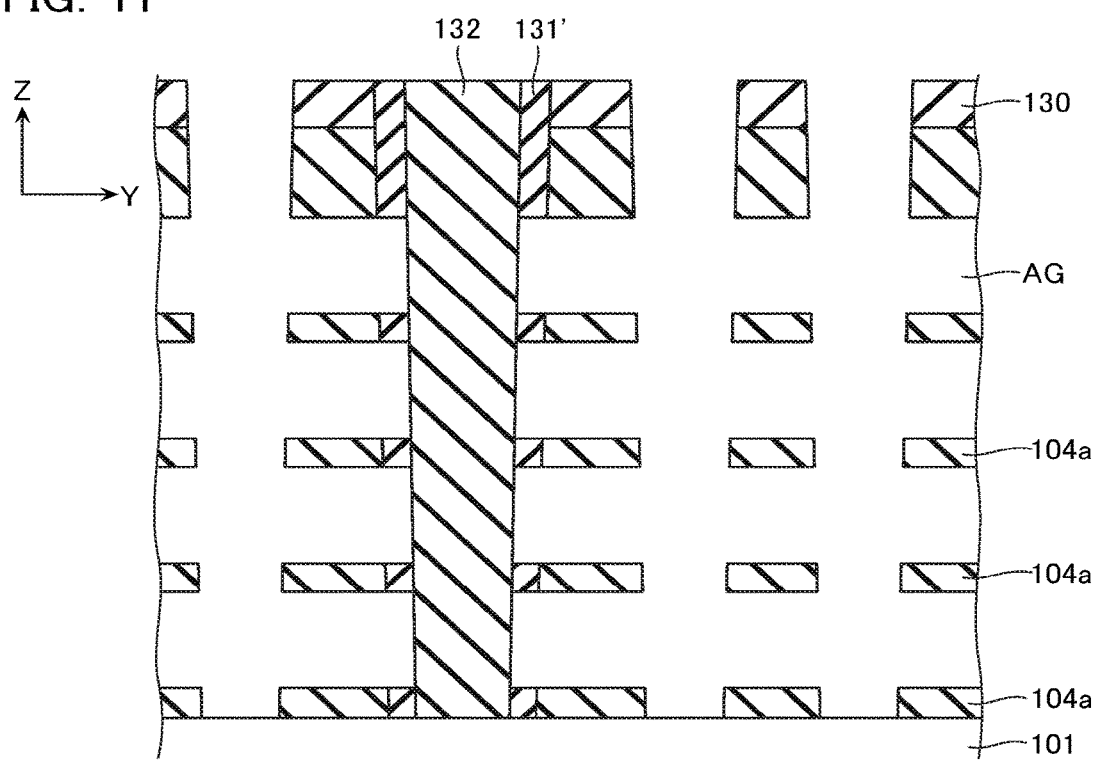

As shown in FIG. 11, the entire sacrificial layer 131 and a part of the sacrificial layer 131' are removed via the holes Ho by the wet etching. This forms voids AG on the region where the sacrificial layer 131 is disposed, a part of the region where the sacrificial layer 131' is disposed, and the region where the hole Ho is included. When the sacrificial layers 131 and 131' are constituted of nitride such as silicon nitride, a phosphoric acid solution can be used as a chemical liquid for the wet etching.

While this process removes the sacrificial layers 131 that occupy a lot of regions of the laminated body, the interlayer insulating layers 132 formed on the groove ST' in the previous process, which is described by referring to FIG. 9, support the posture of the laminated body to prevent the laminated body from collapsing. That is, the interlayer insulating layer 132 formed on the groove ST' functions as a support pillar. This indicates that the interlayer insulating layer 132 can be functioned as the support pillar 111 shown in FIG. 3. The support pillar 111 may be disposed separately from the interlayer insulating layer 132.

Figure 12:
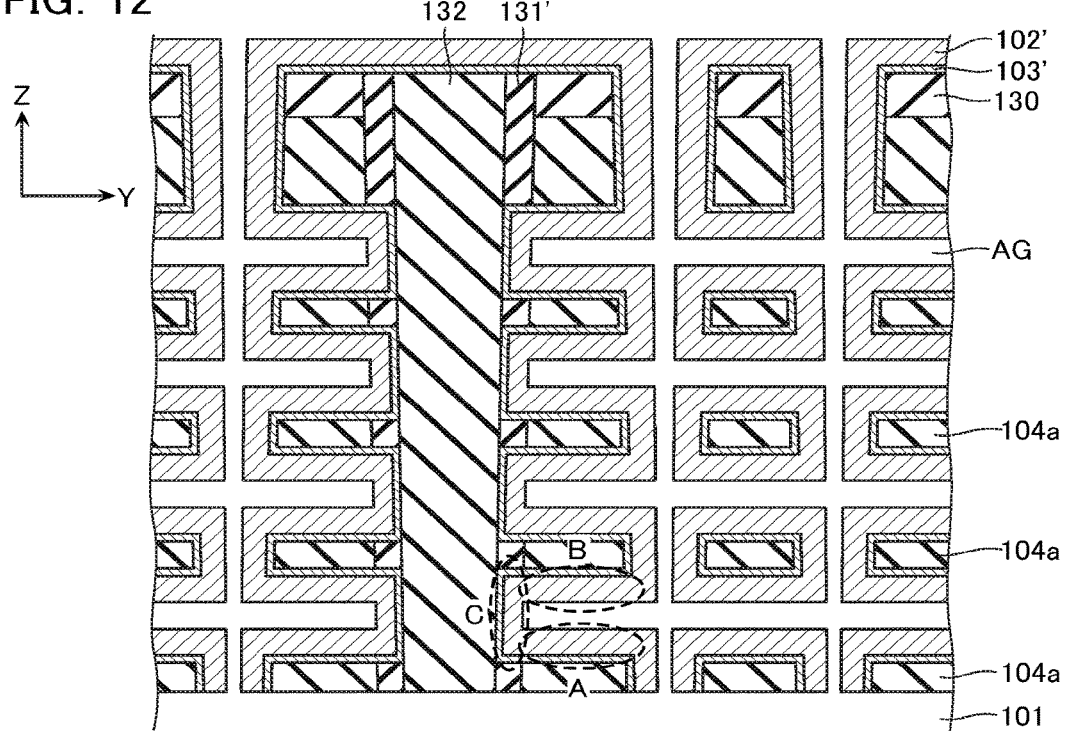

As shown in FIG. 12, on the void AG, a barrier metal layer 103' and a conducting layer 102' are sequentially formed. This integrally forms the barrier metal layer 103' and the conducting layer 102' on the sidewall inside the void AG. In forming the barrier metal layer 103' and the conducting layer 102', not to fill the entire void AG, the barrier metal layer 103' is formed of a thin film along the sidewall inside the void AG, and the conducting layer 102' is formed of a thin film along the barrier metal layer 103'. The barrier metal layer 103' is constituted of metal nitride, for example, titanium nitride (TiN).

This ensures the barrier metal layer 103' and the conducting layer 102' to have a configuration where a part in which the barrier metal layer 103' is disposed on the lower surface of the conducting layer 102' (A shown in FIG. 12) and a part in which the barrier metal layer 103' is disposed on the upper surface of the conducting layer 102' (B shown in FIG. 12) are connected by a part in which the barrier metal layer 103' and the conducting layer 102' extend in the Z direction (C shown in FIG. 12). Then, removing the part C extending in the Z direction in a dividing process performed later ensures the above-described part A and part B to be divided. The dividing process, which will be described later, forms barrier metal layer 103' and conducting layer 102' into the barrier metal layer 103, the conducting layer 102, and the interlayer insulating layer 104b.

Figure 13:
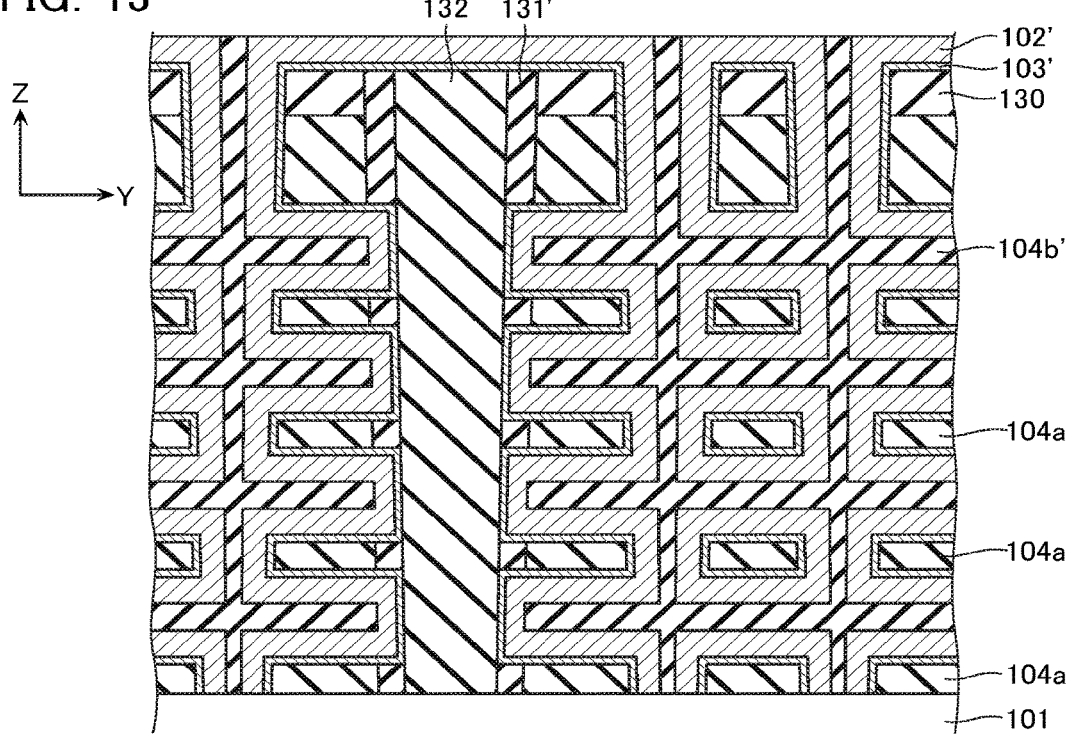

As shown in FIG. 13, remaining parts of the void AG are filled with an interlayer insulating layer 104b'. The dividing process performed later forms the interlayer insulating layer 104b' into the interlayer insulating layer 104b. The interlayer insulating layer 104b' can be constituted of an insulator such as silicon oxide.

Here, in forming the interlayer insulating layer 104a described by referring to FIG. 7 and similar drawing, what is called a dTEOS film that is formed by plasma CVD method or similar method is used. On the other hand, in forming the interlayer insulating layer 104b', a silicon oxide film that is formed by such as LPCVD method, which is different from the plasma CVD method, is used. Therefore, while the interlayer insulating layer 104a and the interlayer insulating layer 104b', which is formed into the interlayer insulating layer 104b in a later process, are constituted of the identical material ($SiO_x$), the physical structures of the surfaces of the interlayer insulating layer 104a and the interlayer insulating layer 104b' or similar property are sometimes different.

Figure 14:
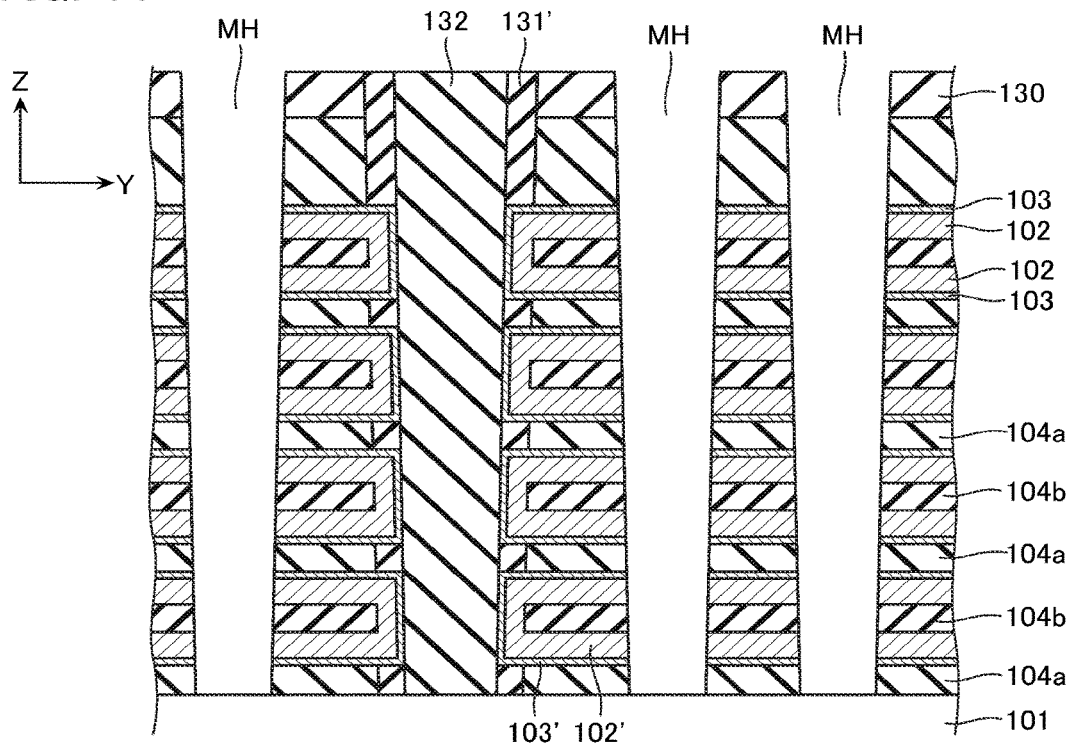

As shown in FIG. 14, a plurality of memory holes MH for disposing the memory pillar 105 is formed. As described above, the memory hole MH is formed on a region including the region on which the hole Ho is formed. This partially removes the integrally formed part of the barrier metal layer 103' and the conducting layer 102' extending in the Z direction (the part C shown in FIG. 12). Then, a region sandwiched between the pair of adjacent memory holes MH has a configuration where a plurality of conducting layers 102 that functions as the word line WL and a plurality of barrier metal layers 103 that is formed on the upper surface or the lower surface of the conducting layer 102 are laminated in the Z direction. A region sandwiched between the memory hole MH and the interlayer insulating layer 132 which are adjacent to each other has a configuration where a plurality of the barrier metal layers 103' and the conducting layer 102' are laminated with a configuration in which two layers of the barrier metal layers 103 and the conducting layers 102 are connected by the sidewall part of the interlayer insulating layer 132.

Figure 15:
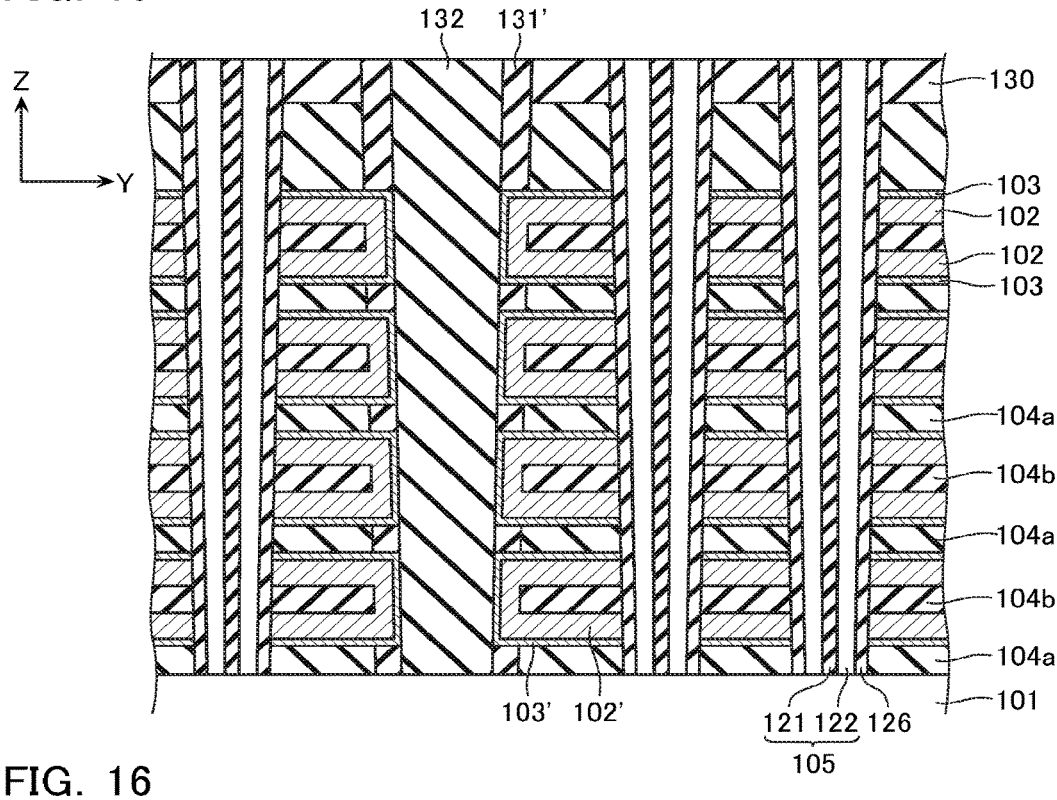

As shown in FIG. 15, on the inner sidewall of the memory hole MH, the memory film 126 and the memory pillar 105 constituted of the columnar semiconductor layer 122 and the core insulating layer 121 are sequentially formed.

Figure 16:
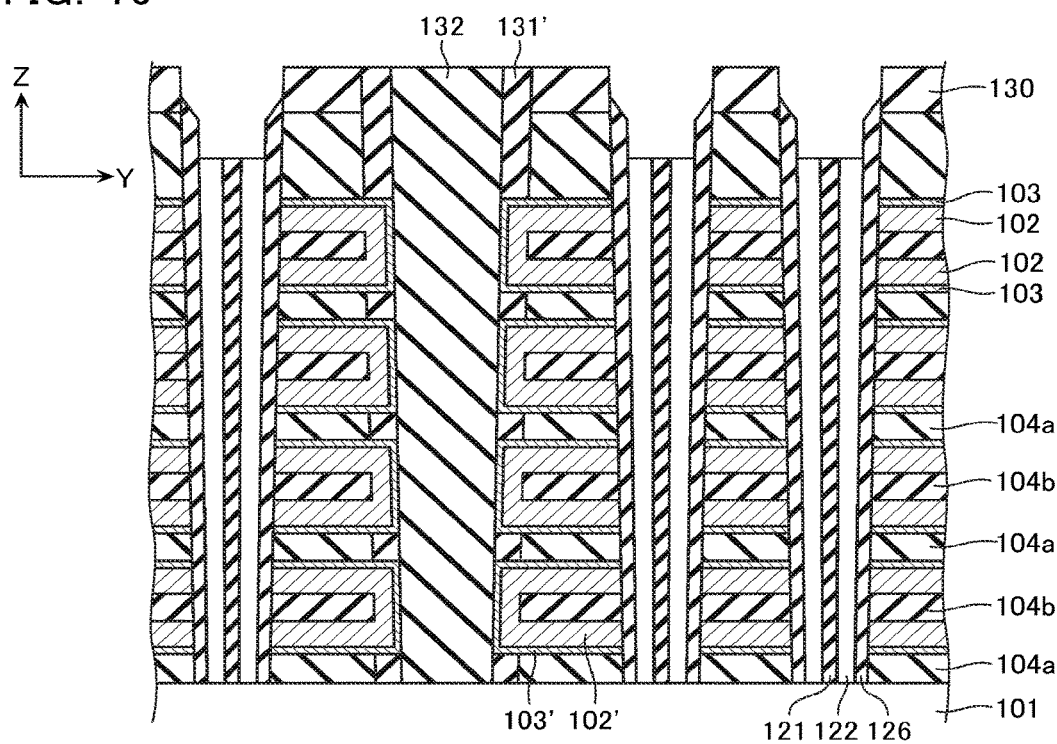

As shown in FIG. 16, a part of the upper portion of the formed memory film 126, columnar semiconductor layer 122, and core insulating layer 121 are etched back to form voids.

Figure 17:
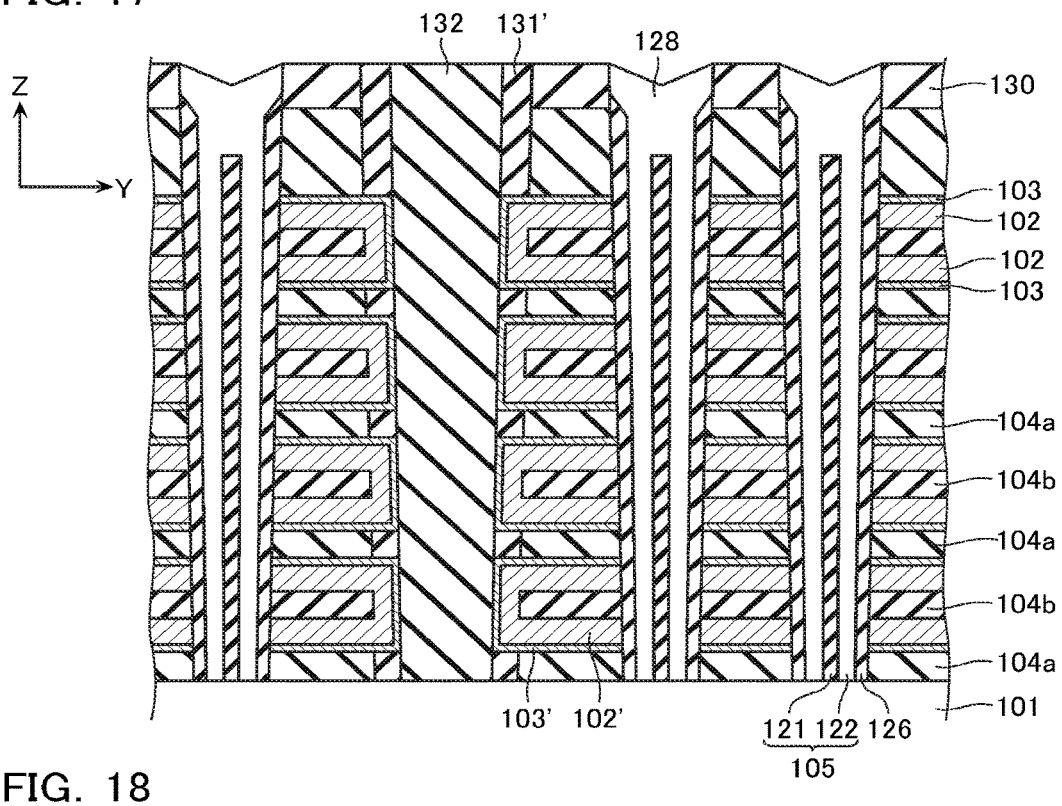

As shown in FIG. 17, on the void formed in the process shown in FIG. 16, the core semiconductor layer 128 constituted of such as amorphous silicon is formed. The core semiconductor layer 128 functions to prevent the core insulating layer 121 from removed when the interlayer insulating layer 132 formed on the groove ST' is removed in a later process. As shown in FIG. 17, the upper portion of the core semiconductor layer 128 may be etched back to be depressed near the center.

Figure 18:
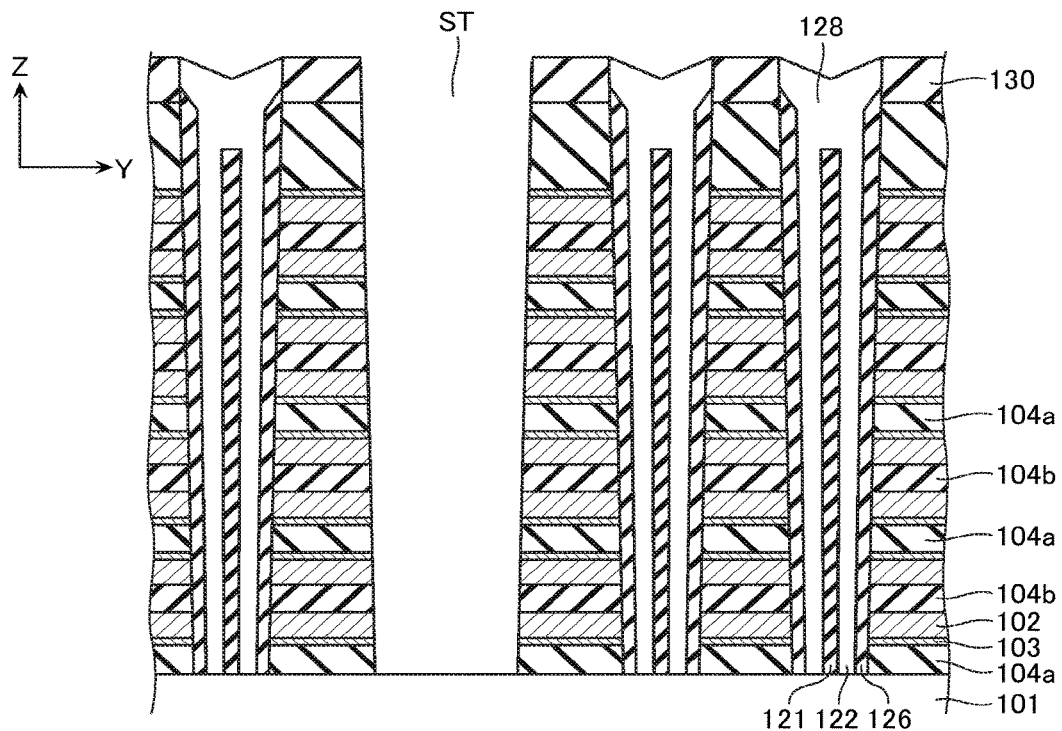

As shown in FIG. 18, the wet etching or similar method is used to remove the interlayer insulating layer 132 and the sacrificial layer 131', which are formed on the groove ST', and the part where the barrier metal layer 103' and the conducting layer 102' are in contact with the sidewall of the interlayer insulating layer 132. This divides the integrally formed barrier metal layer 103' and conducting layer 102' to form the conducting layer 102 that functions as the word line WL and the barrier metal layer 103 that is in contact with the upper surface or the lower surface of the conducting layer 102. In this process, the groove ST is formed.

Lastly, the interlayer insulating film 127, the barrier metal layer 129, and the conducting layer 108 are sequentially formed on the groove ST to form the source contact LI. This provides the configuration shown in FIG. 6.

Forming the word line WL with these processes ensures the barrier metal layer 103 to be formed on only the upper surface or the lower surface of the conducting layer 102 (the word line WL). This ensures the film thickness of the conducting layer 102 to be thick compared with the case where the barrier metal layer is formed on both the upper surface and the lower surface of the word line, and achieves a low-resistance.

As shown in FIG. 12, the conducting layer 102' is formed along the sidewall of the interlayer insulating layer 104a that is exposed by forming the hole Ho and removing the sacrificial layers 131 and 131'. This eliminates the necessity to fill the entire void to form the conducting layer 102', and reduces the generation of the depletion (seam) in the conducting layer 102'.

Further, as shown in FIG. 12, when the conducting layer 102' is formed, only one surface of the upper surface or the lower surface (one surface of both side surfaces) of the conducting layer 102' opposes the interlayer insulating layers 104a or 132. This eliminates the necessity to dispose the barrier metal layer for preventing the conducting layer 102' from peeling from the insulating film on both surfaces.

As indicated in the above description, in the embodiment, one sacrificial layer 131 includes one conducting layer 102 that includes the barrier metal layer 103 on the lower surface and one conducting layer 102 that includes the barrier metal layer 103 on the upper surface. Therefore, the conducting layer 102 that includes the barrier metal layer 103 on the lower surface and the conducting layer 102 that includes the barrier metal layer 103 on the upper surface are formed by the identical number.

Second Embodiment

Next, a semiconductor memory device according to a second embodiment will be described by referring to FIG. 19 to FIG. 25.

Configuration

Figure 19:
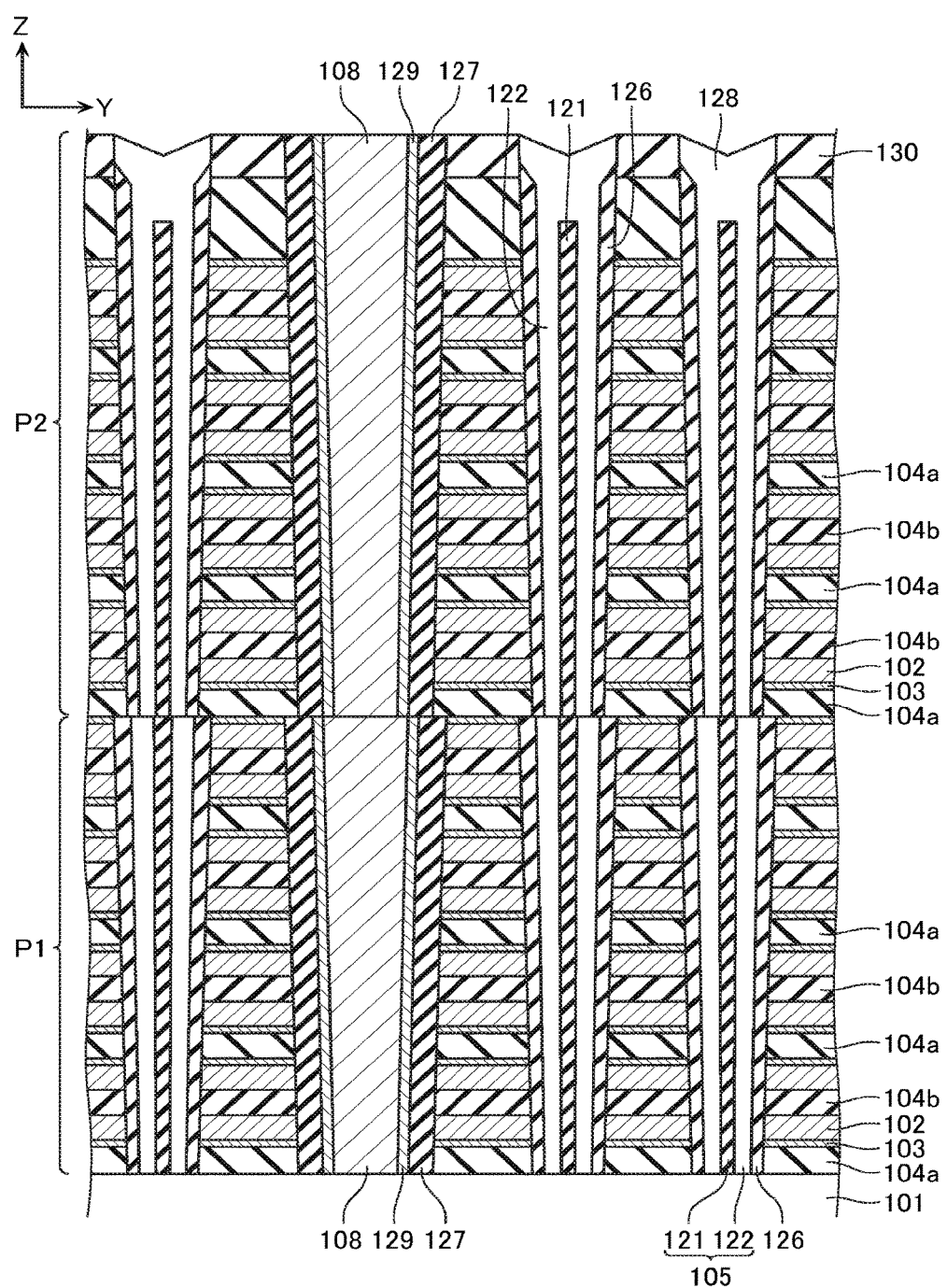
FIG. 19 is a schematic cross-sectional view illustrating a configuration of a semiconductor memory device according to a second embodiment.

FIG. 19 is a cross-sectional view illustrating a configuration of a part of the semiconductor memory device according to the second embodiment. FIG. 19 corresponds to FIG. 6 in the first embodiment.

The semiconductor memory device according to the second embodiment has the overall configuration mostly identical to the semiconductor memory device according to the first embodiment.

The semiconductor memory device according to the second embodiment includes a source contact LI and a memory pillar 105 whose shapes are different from the shapes of the first embodiment.

Specifically, the semiconductor memory device according to the second embodiment is divided into a first part P1 and a second part P2. Then, the diameters of the source contact LI and the memory pillar 105 are not continuous between the first part P1 and the second part P2. The semiconductor memory device according to the second embodiment has the structure where a plurality of tapered shapes, which have the diameter decreasing from the upper to the lower in the Z direction, are laminated.

More specifically, a source contact Li and the memory pillar 105 in the first part P1 have the tapered shape. Then, while the source contact Li and the memory pillar 105 in the second part P2 have the tapered shape as well as the first part P1, the diameter of the lower surface of the source contact Li and the memory pillar 105 in the second part P2 is small compared with the diameter of the upper surface of the source contact Li and the memory pillar 105 in the first part P1.

This configuration is provided by a manufacturing method described later. That is, in the case where the numbers of laminated layers of the word line or similar layer increase in accordance with such as the request for the large capacity of the semiconductor memory device, forming the grooves and the holes after all the interlayer insulating layers and the sacrificial layers are laminated occurs the difference of the diameter between the layers near the upper layer and the layers near the lower layer because of the property of the etching process. This possibly fails to achieve the desired performance as the entire device.

Therefore, as described below, the forming processes of the grooves and the holes are divided into several times to avoid the problem.

Manufacturing Method

Figure 20:
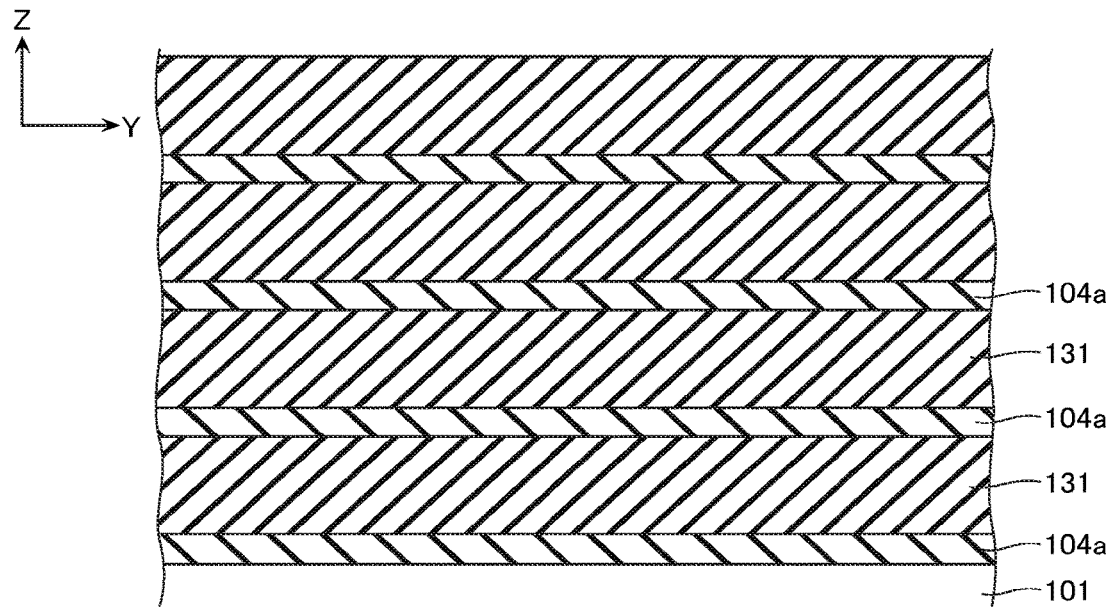
FIG. 20 to FIG. 25 are schematic cross-sectional views illustrating a manufacturing method for the semiconductor memory device.

In the second embodiment, as shown in FIG. 20, firstly, a plurality of interlayer insulating layers 104a and sacrificial layers 131 are alternately laminated on a substrate 101. At this time, the number of the layers to be laminated corresponds to the first part P1 shown in FIG. 19. A cover film may be disposed on the upper surface of the sacrificial layer 131 on the uppermost layer.

Figure 21:
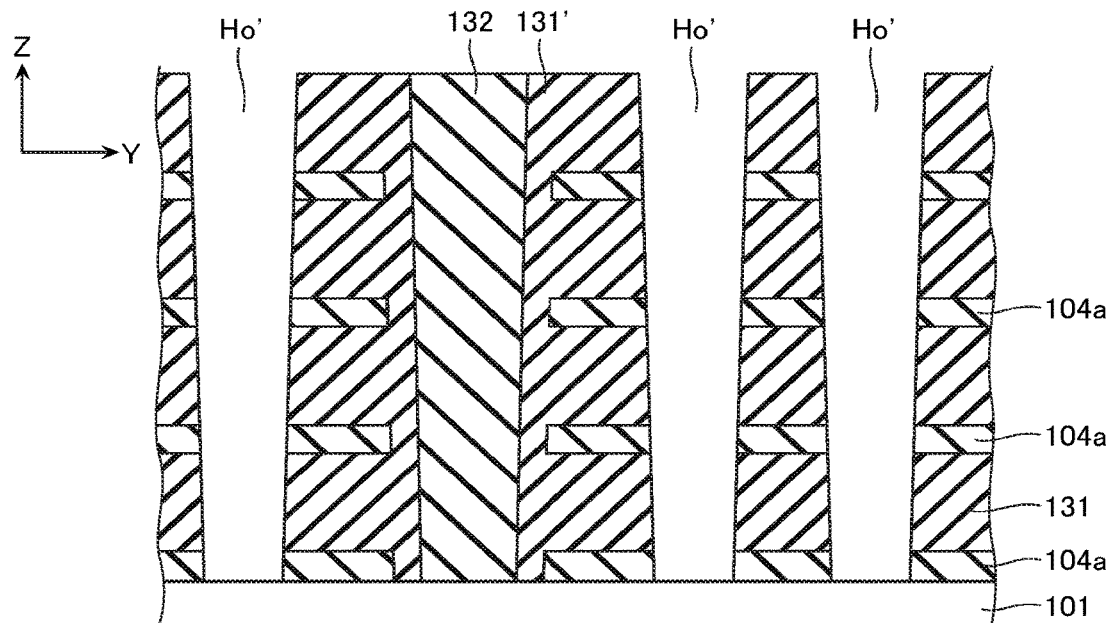

As shown in FIG. 21, grooves are formed to form sacrificial layers 131' and interlayer insulating layers 132, and form a plurality of holes Ho'. This process is identical to the process of FIG. 8 to FIG. 10 in the first embodiment.

Figure 22:
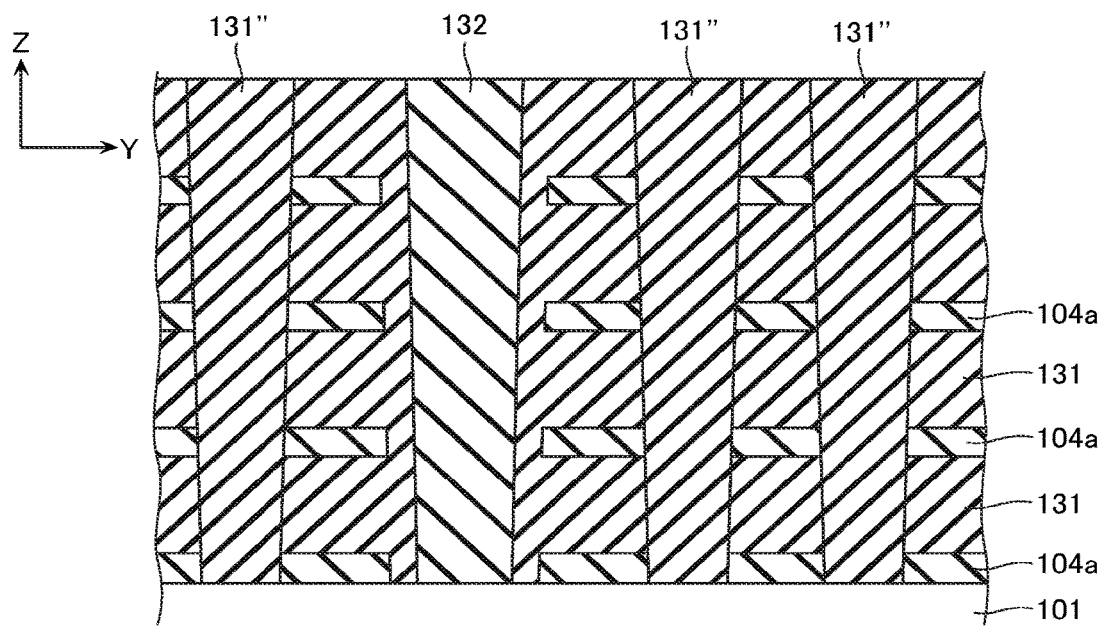

As shown in FIG. 22, a sacrificial layer 131" is formed on the hole Ho' and flattened by CMP or similar method. The sacrificial layer 131" can be formed of material similar to the sacrificial layers 131 and 131'.

Figure 23:
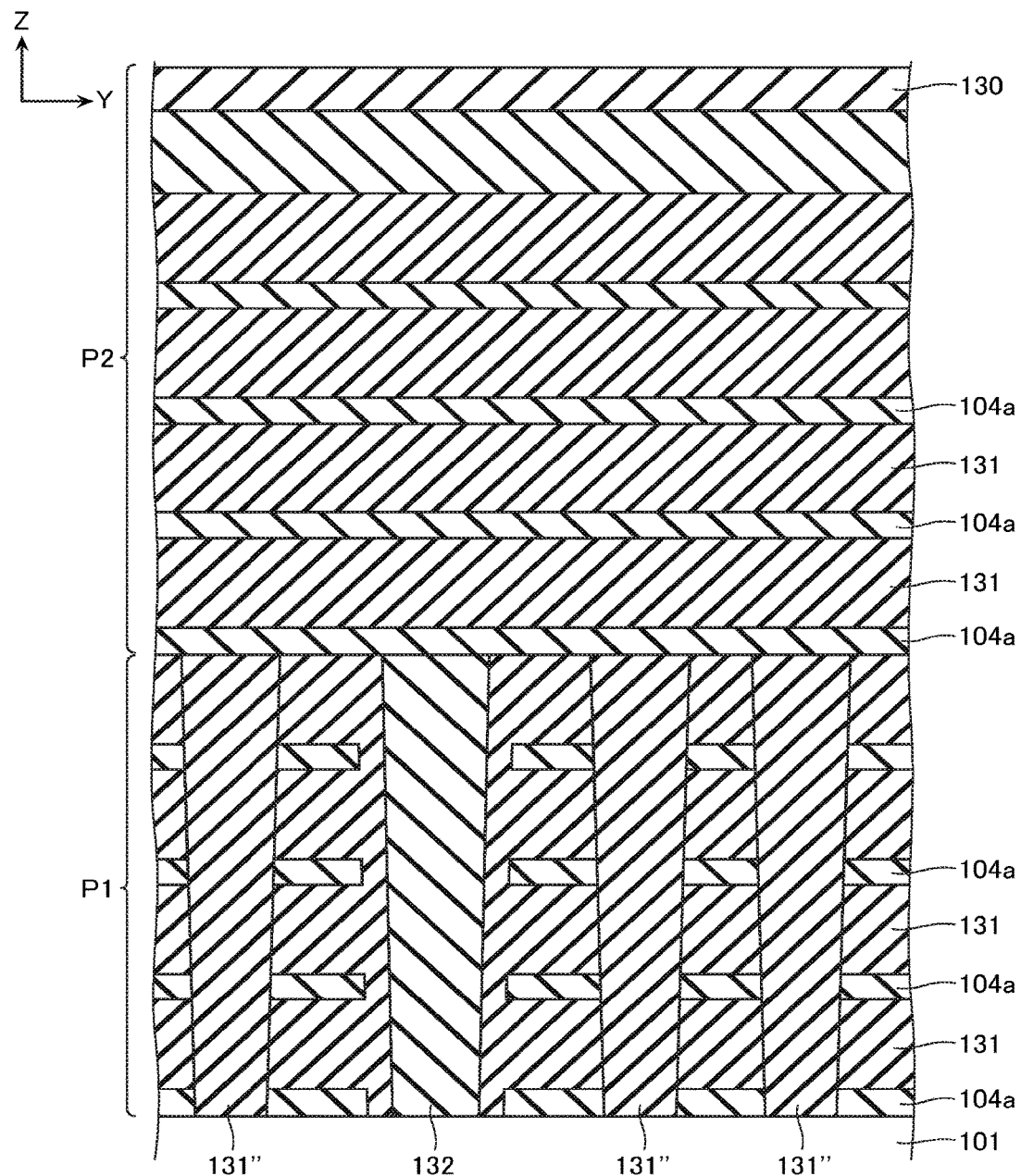

As shown in FIG. 23, on the upper surface of the flattened laminated body, the interlayer insulating layers 104a, the sacrificial layers 131, and a cover film 130 are formed again. The part laminated in this process corresponds to the second part P2.

Figure 24:
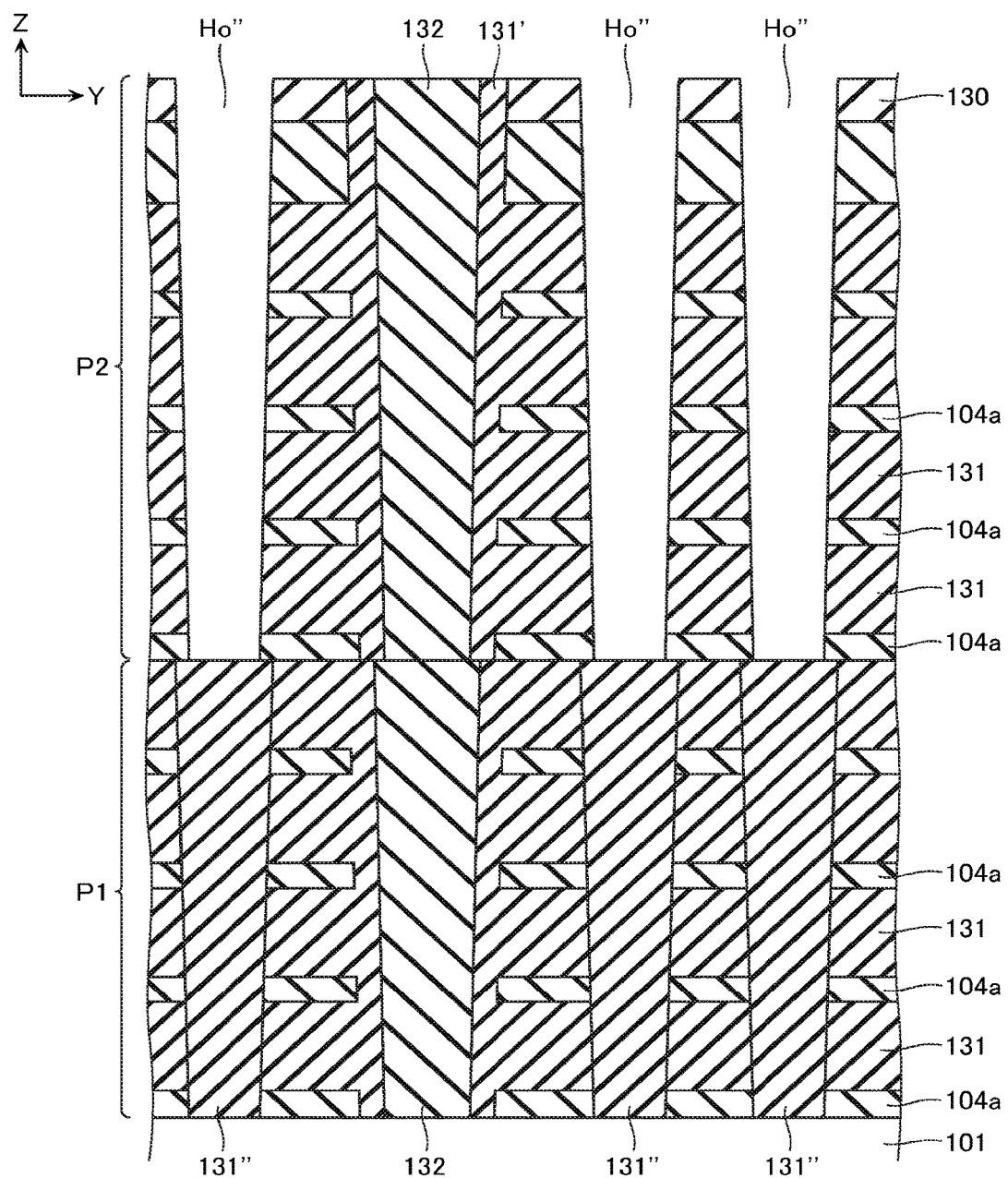

As shown in FIG. 24, the grooves are formed to form the sacrificial layer 131' and the interlayer insulating layer 132. Then, a plurality of holes Ho" are formed.

Figure 25:
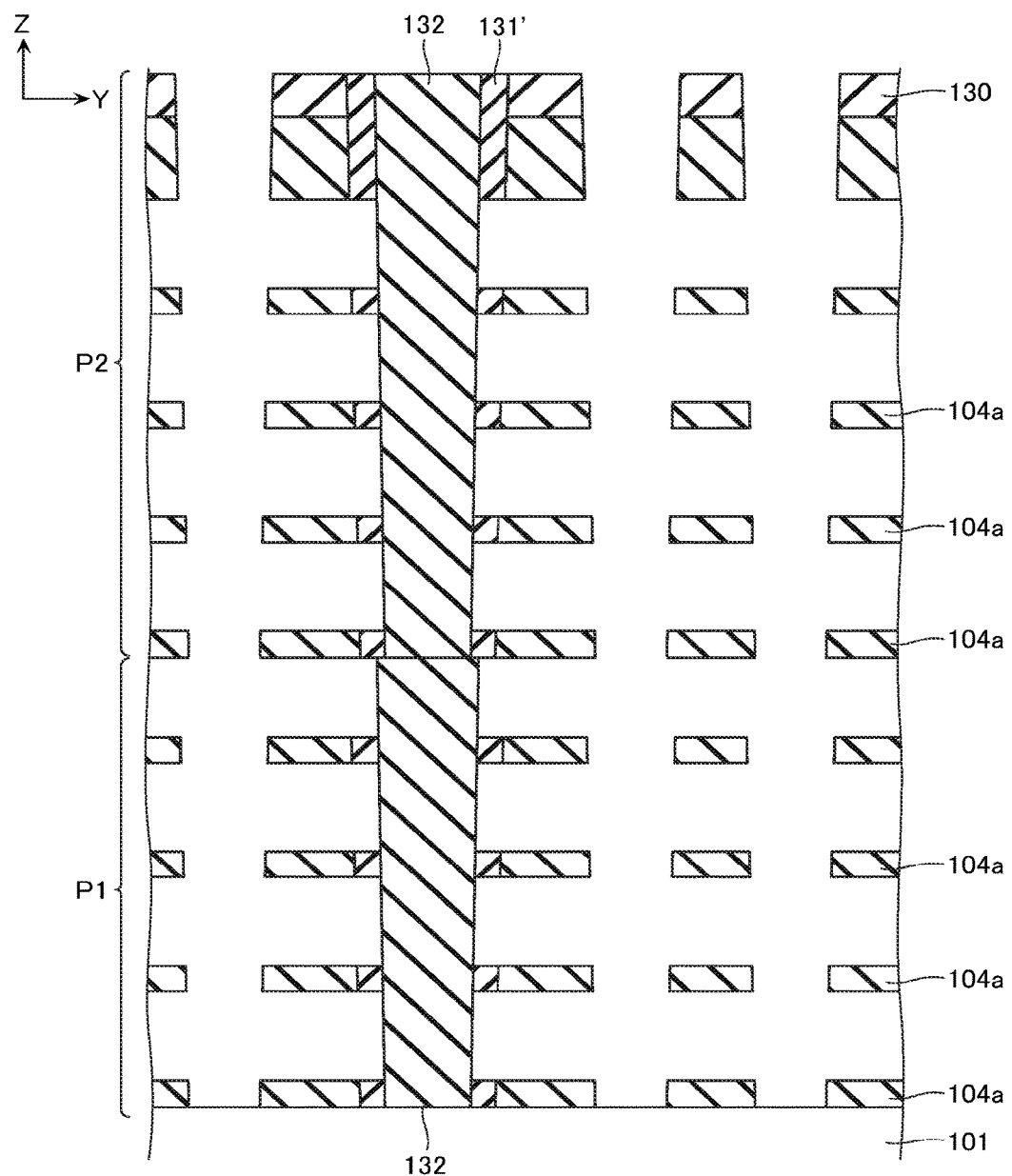

As shown in FIG. 25, the sacrificial layers 131 and 131' are removed via the holes Ho". This process is identical to the process described in the first embodiment with reference to FIG. 11.

Then, as well as the process described in the first embodiment with reference to FIG. 12 to FIG. 18, performing the processing or similar process to the word line WL and the memory pillar 105 to obtain the configuration shown in FIG. 19.

As described above, in the embodiment, the processing of the source contact LI, the word line WL, the memory pillar 105, and similar part is performed dividing into the first part P1 and the second part P2 that are vertically divided. This ensures to decrease the diameter difference between the upper layer and the lower layer of the source contact LI and the memory pillar 105 even if the number of laminated layers of the conducting layer that constitutes the word line WL increases. Therefore, the possibility to deteriorate the device property because of the increase of the diameter difference can be avoided.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of memory cells three-dimensionally disposed on a semiconductor substrate; and
a plurality of conducting layers disposed in a laminating direction, wherein
each of the plurality of the conducting layers is connected to each of the plurality of the memory cells, and has a structure where a first conductive film and a second conductive film are laminated in the laminating direction, and
the conducting layers adjacent to one another in the laminating direction have different laminating orders of the first conductive film and the second conductive film.

2. The semiconductor memory device according to claim 1, wherein
the first conductive film is a barrier metal film and the second conductive film is a metal film.

3. The semiconductor memory device according to claim 2, wherein
the conducting layer on a lowermost layer in the laminating direction has a configuration where the barrier metal film is disposed as a lower layer of the conducting layer, and the metal film is disposed as an upper layer of the conducting layer.

4. The semiconductor memory device according to claim 2, wherein
the conducting layer on an uppermost layer in the laminating direction has a configuration where the metal film is disposed as a lower layer of the conducting layer, and the barrier metal film is disposed as an upper layer of the conducting layer.

5. The semiconductor memory device according to claim 2, wherein
the barrier metal film is constituted of metal nitride.

6. The semiconductor memory device according to claim 2, wherein
the conducting layer with the barrier metal film as a lower layer and the metal film as an upper layer, and the conducting layer with the metal film as a lower layer and the barrier metal film as an upper layer are disposed in an identical number.

7. The semiconductor memory device according to claim 1, further comprising:
a semiconductor layer extending in the laminating direction, the semiconductor layer functioning as a channel body of the memory cell.

8. The semiconductor memory device according to claim 7, wherein
the semiconductor layer includes a core semiconductor layer on an upper portion of the semiconductor layer.

9. The semiconductor memory device according to claim 8, wherein
the core semiconductor layer is constituted of amorphous silicon.

10. The semiconductor memory device according to claim 1, wherein
the conducting layer on an uppermost layer has an upper surface covered with a cover film.

11. The semiconductor memory device according to claim 1, wherein
the memory cell includes an electric charge accumulating layer.

12. The semiconductor memory device according to claim 1, wherein
the plurality of conducting layers includes interlayer insulating layers between the conducting layers, and
the interlayer insulating layers adjacent to one another in a laminating direction are constituted of identical material, and are different in physical structures of surfaces thereof.

13. The semiconductor memory device according to claim 1, further comprising:
a source contact extending in the laminating direction, wherein
the source contact has a tapered shape in which a diameter increases with separating away from the semiconductor substrate.

14. The semiconductor memory device according to claim 13, wherein
the source contact has a structure where a plurality of parts with the tapered shape are laminated.

15. The semiconductor memory device according to claim 1, wherein
each of the plurality of the conducting layers functions as a word line.

16. The semiconductor memory device according to claim 1, wherein
the plurality of the conducting layers disposed in the laminating direction include two first conductive films opposing one another, with respect to one interlayer insulating layer formed therebetween, and two second conductive films opposing one another, with respect to another interlayer insulating layer formed therebetween, repeatedly laminated in alternation in the laminating direction.

17. The semiconductor memory device according to claim 1, wherein
each of the plurality of memory cells includes block layer, and
each of the block layers contacts with both of the first conductive film and the second conductive film.

18. A method for manufacturing a semiconductor memory device, wherein
the semiconductor memory device includes a plurality of memory cells and a plurality of conducting layers, the plurality of memory cells being three-dimensionally disposed on a semiconductor substrate, the plurality of conducting layers being disposed in a laminating direction, and the plurality of conducting layers being connected to the plurality of the memory cells, and
the manufacturing method comprises:
alternately laminating a plurality of first interlayer insulating layers and sacrificial films in a laminating direction on the semiconductor substrate;
forming a support pillar that passes through the plurality of the first interlayer insulating layers and the sacrificial films;
forming a first hole that passes through the plurality of the first interlayer insulating layers and the sacrificial films;
removing the sacrificial film via the first hole to form a void;
forming a first conductive film, a second conductive film, and a second interlayer insulating layer on the inner wall of the void; and
forming a second hole in a region corresponding to the first hole and forming a groove in a region corresponding to the support pillar to remove a part where the first conductive film and the second conductive film extend in the laminating direction, so as to form two layers of the conducting layer.

19. The method for manufacturing the semiconductor memory device according to claim 18, wherein
the first interlayer insulating layer and the second interlayer insulating layer employ identical material and different film forming methods.

20. The method for manufacturing the semiconductor memory device according to claim 18, further comprising
forming at least an electric charge accumulating film inside the second hole internally to form the memory cell, and
forming a semiconductor layer as a channel body of the memory cell.

21. The method for manufacturing the semiconductor memory device according to claim 18, further comprising
forming at least a conductive film inside the groove to form a source contact.

* * * * *